United States Patent [19]

Hitomi

[11] Patent Number: 4,855,627

[45] Date of Patent: Aug. 8, 1989

[54] FILTER CIRCUIT

[75] Inventor: Hisakazu Hitomi, Yokohama, Japan

[73] Assignee: Kabushiki Kaisha Toshiba, Kanagawa, Japan

[21] Appl. No.: 143,175

[22] Filed: Jan. 13, 1988

[30] Foreign Application Priority Data

Jan. 14, 1987 [JP] Japan .................................. 62-5105
Jan. 14, 1987 [JP] Japan .................................. 62-6798

[51] Int. Cl.⁴ ........................ H03K 5/00; H03K 3/01; H03F 1/30
[52] U.S. Cl. .................................... 307/520; 307/491; 307/521; 307/296.1; 307/296.5; 328/167
[58] Field of Search ............... 307/520, 264, 521, 525, 307/271, 491; 328/167, 296.5, 296.1 R; 330/51, 9, 107, 109

[56] References Cited

U.S. PATENT DOCUMENTS

| | | | |
|---|---|---|---|
| 3,805,178 | 4/1974 | Rollett | 328/167 |
| 4,040,081 | 8/1977 | Ninomiya et al. | 307/264 |
| 4,063,184 | 12/1977 | Ohsawa | 328/165 |
| 4,277,749 | 7/1981 | Traub | 328/165 |
| 4,288,707 | 9/1981 | Katakura | 307/264 |
| 4,393,351 | 7/1983 | Gregorian et al. | 307/491 X |
| 4,468,749 | 8/1984 | Kato et al. | 307/520 |
| 4,543,534 | 9/1985 | Temes et al. | 330/51 |
| 4,575,650 | 3/1986 | Naimpally et al. | 328/167 |
| 4,623,854 | 11/1986 | Kuraishi | 330/9 |
| 4,651,034 | 3/1987 | Sato | 328/167 |
| 4,721,870 | 1/1988 | Rector et al. | 328/167 |

FOREIGN PATENT DOCUMENTS

| | | | |
|---|---|---|---|
| 0156870 | 5/1978 | Netherlands | 328/165 |
| 2019151 | 10/1979 | United Kingdom | 307/520 |

OTHER PUBLICATIONS

Geiger et al., "Switched-Resistor Filters—A Continuous Time Approach to Monolithic MOS Filter Design," IEEE Transactions on Circuits and Systems, vol. CAS-29, No. 5, pp. 306-315, May 1982.

Primary Examiner—John S. Heyman
Assistant Examiner—Huy K. Mai
Attorney, Agent, or Firm—Finnegan, Henderson, Farabow, Garrett, & Dunner

[57] ABSTRACT

A filter circuit for filtering an input signal including a DC component signal with a prescribed DC level and an AC component signal. The filter circuit includes a time constant circuit for imparting the input signal with prescribed frequency characteristics, the time constant circuit including a variable impedance device and a capacitor, and a control signal source for supplying a control signal for adjusting the impedance of the variable impedance device, the control signal source including a DC source for generating a DC control signal and a compensation source for generating a compensation signal equivalent to the AC component signal of the input signal.

10 Claims, 5 Drawing Sheets

FILTER CIRCUIT

BACKGROUND OF THE INVENTION

1. Field of the Invention

The present invention relates to a filter circuit and, more particularly, to a filter circuit using variable impedance devices.

2. Description of the Prior Art

In general, a filter circuit employs a time constant circuit for determining the filter characteristics, i.e., the frequency characteristics of the filter circuit. As is well known, time constant circuits are constituted by resistive devices and capacitive devices. The time constant circuit requires that the time constant be maintained stable at a predetermined value. When such a filter circuit is fabricated in an integrated circuit (referred as IC hereafter), it is necessary to adjust the time constant of the time constant circuit, since the resistances and the capacitances of the resistive devices and capacitive devices of the time constant circuits fabricated in ICs are not precise. Further, the resistances and the capacitances of the resistive devices and capacitive devices of the time constant circuits fabricated in ICs are unstable in relation to temperature change and long term use.

For the above reason, in ICs, variable impedance devices, such as MOS FETs (Metal Oxide Semiconductor Field Effect Transistor), are used for the resistive devices. This is because the variable impedance devices, such as MOS FETs, are favorable for adjusting the time constant of the time constant circuit.

Referring now to FIGS. 1 and 2, some conventional filter circuits using variable impedance devices, such as MOS FETs, will be explained. The filter circuits shown in FIGS. 1 and 2 are active and passive type second order filter circuits. Particularly, the active type filter circuit, as shown in FIG. 1, is a so-called Sallen-kye type filter circuit.

The Sallen-kye type filter circuit shown in FIG. 1 is comprised of two time constant circuits 10a and 10b and a buffer amplifier 12 which are connected in series between an input terminal 14 and an output terminal 16. Each of the two time constant circuits 10a and 10b has a variable impedance device comprised of a MOS FET 18a (18b), and a capacitor 20a (20b). The MOS FETs 18a and 18b of the time constant circuits 10a and 10b and the buffer amplifier 12 are connected in series between the input terminal 14 and the output terminal 16. The capacitor 20a of the preceding time constant circuit 10a is connected in parallel with the series circuit of the MOS FET 18b and the buffer amplifier 12. The capacitor 20b of the following time constant circuit 10b is connected between the drain of the second MOS FET 18b and a ground terminal 22. The gates of the MOS FETs 18a and 18b are coupled to a terminal of a source 24 for supplying a control signal Vc. Another terminal of the control signal source 24 is connected to the ground terminal 22.

An input signal Vin on the input terminal 14 is applied to the buffer amplier 12 through the time constant circuits 10a and 10b in series, and an output signal Vout appears on the output terminal 16. Resistances R18a and R18b of the MOS FETs 18a and 18b vary in accordance with the control signal Vc fed to the gates of the MOS FETs 18a and 18b. Thus, the time constants T10a and T10b of the time constant circuits 10a and 10b can be adjusted to desirable amounts by the control signal Vc.

The transfer function of the active type Sallen-kye filter circuit, as shown in FIG. 1, is carried out as follows. If the resistances R18a and R18b of the MOS FETs 18a and 18b satisfy the relations R18a=R18b=R18, and the amplification factor K of the buffer amplifier 12 is 1, $$Vout/Vin = \frac{1/(R18^2 \cdot C20a \cdot C20b)}{S^2 + S/(R18 \cdot C20a) + 1/(R18^2 \cdot C20a \cdot C20b)} \quad (1)$$

wherein S is a constant given by the equations: $S=1/(j \cdot \omega)$ or $S=1/(j \cdot 2\pi f)$. In the equations, j is a unit imaginary number, $\omega$ is the angular frequency of the input signal Vin, and f is the frequency of the input signal Vin.

Hereupon, if the time constants TCa and TCb of the time constant circuits 10a and 10b satisfy the relationships:

$$TCa=R18 \cdot C20a, \; TCb=R18 \cdot C20b, \quad (2)$$

The following equation is obtained:

$$Vout/Vin = \frac{1/(TCa \cdot TCb)}{S^2 + S/TCa + 1/(TCa \cdot TCb)}. \quad (3)$$

In case the filter circuit is fabricated in the IC configuration, the absolute values of the capacitances C20a and C20b are largely dispersed (to the extent of ±30%), but the relative accuracy is good. For example, if the capacitance C20a is enlarged by +10%, the capacitance C20b is enlarged also by +10%. Therefore, against this dispersion, if the gate voltage of the MOS FETs 18a and 18b, i.e. the control signal Vc is regulated, and the resistance R18 is reduced by 10%, the time constants TCa and TCb can be constantly maintained.

The only difference between the passive type second order filter circuit shown in FIG. 2 and the active type one, i.e., the Sallen-kye type filter circuit shown in FIG. 1, is that the former one lacks a buffer amplifier. Thus, the transfer function of the passive type filter circuit shown in FIG. 2 is almost the same as the transfer function for the Sallen-kye type filter circuit given by the above equation (3).

In the conventional filter circuits using MOS FETs, as shown in FIGS. 1 and 2, the time constants TCa and TCb of the time constant circuits 10a and 10b comprising the filter circuit are apt to vary in response to the input signal Vin applied to the filter circuit, as described later. As a result, the filter characteristics defined by the time constants TCa and TCb become unstable and worsen the S/N (signal to noise ratio) of the signal passing through the filter circuit.

That is, the input signal Vin applied to the filter circuit includes a DC component Vin(DC) and an AC component Vin(AC). Thus, the input signal Vin is given as follows, $$Vin = Vin(DC) + Vin(AC)$$

The input signal Vin is applied to the source terminal of the MOS FET 18a. On the other hand, the control signal Vc is applied to the gate terminal thereof. Thus, the gate to source voltage VGSa of the MOS FET 18a is given as follows, $$VGSa = Vin - Vc = Vin(DC) + Vin(AC) - Vc \quad (4)$$

The equation (4) shows that the gate to source voltage VGSa of the MOS FET 18a varies in response to the AC component Vin(AC) of the input signal Vin.

The signal Vin passing through the preceding time constant circuit 10a is applied to the source terminal of the MOS FET 18b of the following time constant circuit 10b. On the other hand, the control signal Vc is applied to the gate terminal thereof. Thus, the gate to source voltage VGSb of the MOS FET 18b also varies in response to the input signal Vin, i.e., the AC component Vin(AC) of the input signal Vin.

The variations of the gate to source voltages VGSa and VGSb cause the impedances of the MOS FETs 18a and 18b to change so that the time constants TCa and TCb of the time constant circuits 10a and 10b vary. Accordingly, the filter characteristics of the filter circuit vary due to the variation of the input signal Vin, i.e., the AC component Vin(AC) of the input signal Vin. As a result, the S/N of the signal passing through the filter circuit is worsened by the variation of the input signal Vin. The deterioration of the S/N is particularly remarkable for frequencies around the cut-off frequency of the filter circuit.

SUMMARY OF THE INVENTION

Accordingly, an object of the present invention is to improve the drawbacks of the conventional filter circuits.

Another object of the present invention is to provide a filter circuit which has stable filter characteristics.

In order to achieve the above objects, the filter circuit for filtering an input signal including a DC component signal with a prescribed DC level and an AC component signal includes a time constant circuit for imparting the input signal with prescribed frequency characteristics, the time constant circuit including a variable impedance device and a capacitor, and a control signal source for supplying a control signal for adjusting the impedance of the variable impedance device, the control signal source including a DC source for generating a DC control signal and a compensation source for generating a compensation signal equivalent to the AC component signal of the input signal.

BRIEF DESCRIPTION OF THE DRAWINGS

A more complete appreciation of the present invention and many of the attendant advantages thereof will be readily obtained as the same become better understood by reference to the following detailed description when considered in connection with the accompanying drawings, wherein.

DESCRIPTION OF THE PREFERRED EMBODIMENTS

Figure 1:
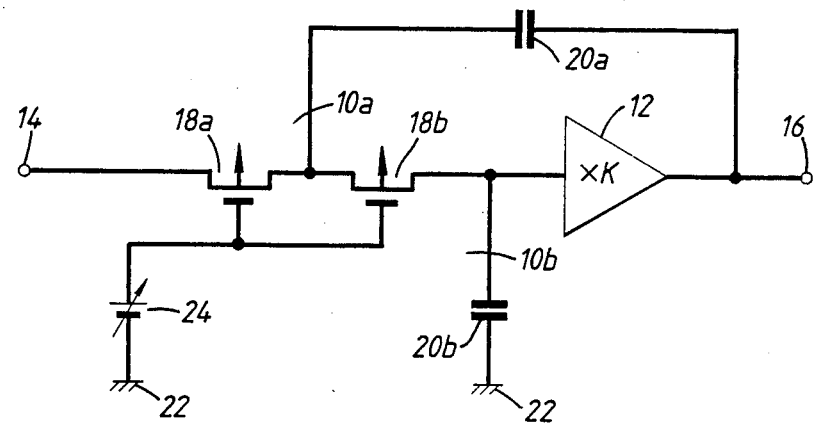
FIGS. 1 and 2 are circuit diagrams of conventional filter circuits using MOS FETs.

The present invention will now be described in detail with reference to the accompanying drawings, namely, FIGS. 3 through 9. Throughout the drawings, like reference numerals and letters are used to designate devices like or equivalent to those used in FIGS. 1 and 2 (Prior Art Circuits) for the sake of simplicity of explanation.

Figure 3:
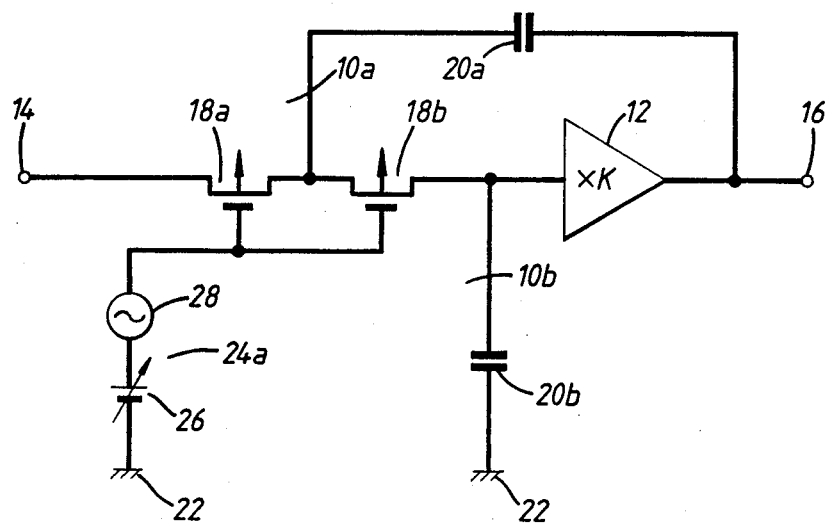
FIG. 3 is a schematic circuit diagram to show a first embodiment of the filter circuit using MOS FETs according to the present invention.

FIG. 3 is a block diagram showing an embodiment of the filter circuit according to the present invention. As shown in FIG. 3, the filter circuit according to the present invention has the configuration of an active second order Sallen-kye type filter circuit.

The active type filter circuit shown in FIG. 3 is comprised of two time constant circuits 10a and 10b and a buffer amplifier 12 which are connected in series between an input terminal 14 and an output terminal 16. Each of the two time constant circuits 10a and 10b has a variable impedance device, such as a MOS FET 18a (18b), and a capacitor 20a (20b). The MOS FETs 18a and 18b of the time constant circuits 10a and 10b and the buffer amplifier 12 are connected in series between the input terminal 14 and the output terminal 16. The capacitor 20a of the preceding time constant circuit 10a is connected in parallel with the series circuit of the MOS FET 18b and the buffer amplifier 12. The capacitor 20b of the following time constant circuit 10b is connected between the drain of the second MOS FET 18b and a ground terminal 22.

The gate terminal of the MOS FET 18a in the preceding time constant circuit 10a is coupled to a terminal of a source 24a for supplying a control signal 24a is connected to the ground terminal 22. The control signal source 24a is comprised of a series circuit of a DC control signal source 26 for supplying a DC control signal Ec and an AC compensation signal source 28 for supplying an AC compensation signal Vcom, as described later. Thus, the control signal Vca is given as follows, $$Vca = Ec + Vcom \qquad (5)$$

The control signal Vca is applied to the gate terminals of the MOS FETs 18a and 18b. On the other hand, the input signal Vin is applied to the source terminals thereof. The input signal Vin applied to the filter circuit includes a DC component Vin(DC) and an AC component Vin(AC). Thus, the input signal Vin is given as follows, $$Vin = Vin(DC) + Vin(AC)$$

The compensation signal Vcom supplied from the compensation signal source 28 is set to vary with variations in the AC component Vin(AC) of the input signal Vin. Thus, the relationship Vcom=Vin(AC) is established.

The gate to source voltage VGSa of the MOS FET 18a is given as follows, $$\begin{aligned} VGSa &= Vin - Vca \qquad (6)\\ &= [Vin(DC) + Vin(AC)] - [Ec + Vcom]\\ &= [Vin(DC) + Vin(AC)] - [Ec + Vin(AC)]\\ &= Vin(DC) - Ec \end{aligned}$$

In the equation (6), the terms Vin(DC) and Ec are constants. Thus, the equation (6) shows that the gate to source voltages VGSa and VGSb of the MOS FETs 18a and 18b are free from the AC component Vin(AC) of the input signal Vin.

The compensation signal Vcom supplied from the compensation signal source 28, which is equivalent to the AC component Vin(AC) of the input signal Vin, suppresses the variations of the gate to source voltages VGSa and VGSb of the MOS FETs 18a and 18b due to the AC component Vin(AC) of the input signal Vin. Therefore, the impedance variations of the MOS FETs 18a and 18b are avoided, so that the signal Vin passing through the filter circuit is not worsened by the variation of the input signal Vin, i.e., the AC component Vin(AC). Particularly, deterioration of the S/N of the signal Vin around the cut-off frequency of the filter circuit is prevented.

Figure 4:
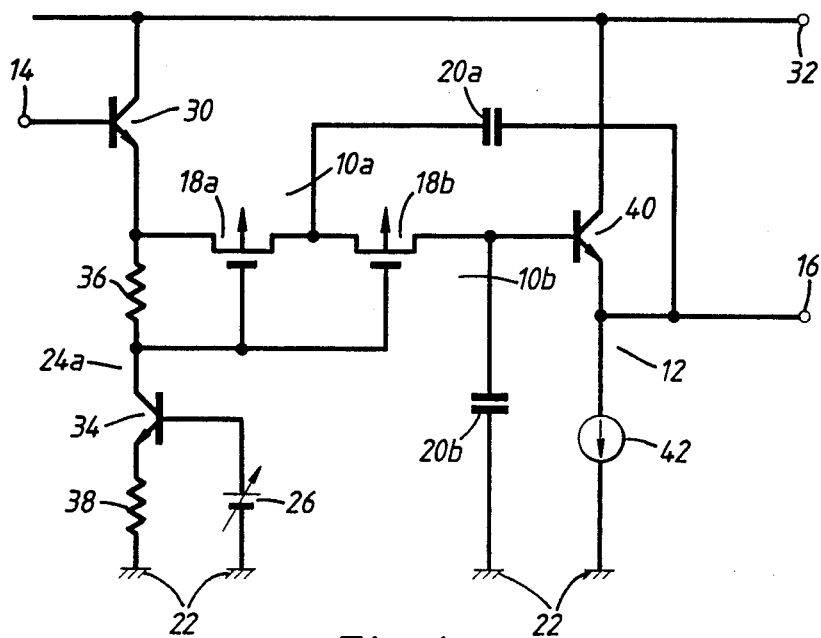
FIG. 4 is a practical circuit diagram of the filter circuit shown in FIG. 3.

Referring now to FIG. 4, a practical circuit of the filter circuit shown in FIG. 3 will be described briefly.

In the filter circuit shown in FIG. 4, an input signal Vin is supplied to the base terminal of a buffer transistor 30. The input signal Vin includes a DC component Vin(DC) and an AC component Vin(AC).

The collector terminal of the buffer transistor 30 is coupled to a power supply source 32. The emitter terminal of the buffer transistor 30 is coupled to the collector terminal of a transistor 34 through a level shift resistor 36. The transistor 34 comprises a control signal source 24a, together with the level shift resistor 36, a resistor 38 and a DC control signal source 26. The resistor 38 is connected between the emitter terminal of the transistor 34 and the ground terminal 22. The DC control signal source 26 is connected between the base terminal of the transistor 34 and the ground terminal 22.

The signal Vin passing through the buffer transistor 30 is applied to the control signal source 24a. On the other hand, a DC control signal is applied to the base terminal of the transistor 34. As a result, a control signal Vca appears on the collector terminal of the transistor 34. The control signal Vca includes a DC control signal Ec and an AC compensation signal Vcom which is equivalent to the AC component Vin(AC) of the input signal Vin.

The control signal Vca on the collector terminal of the transistor 34 is applied to the gate terminals of the MOS FETs 18a and 18b. On the other hand, the signal Vin is applied to the source terminals of the MOS FETs 18a and 18b. Thus, the gate to source voltages VGSa and VGSb of the MOS FETs 18 and 18b are maintained constant, in spite of the variation of the signal Vin, i.e., the AC component Vin(AC) of the input signal Vin.

The signal passing through the MOS FETs 18a and 18b is applied to the buffer amplifier 12. The buffer amplifier 12 is comprised of a transistor 40 and a constant current source 42 connected in series between the power supply source 32 and the ground terminal 22. The signal Vin passing through MOS FETs 18a and 18b is applied to the base terminal of the transistor 40. An output terminal 16 of the filter circuit is connected to the emitter terminal of the transistor 40.

Figure 5:
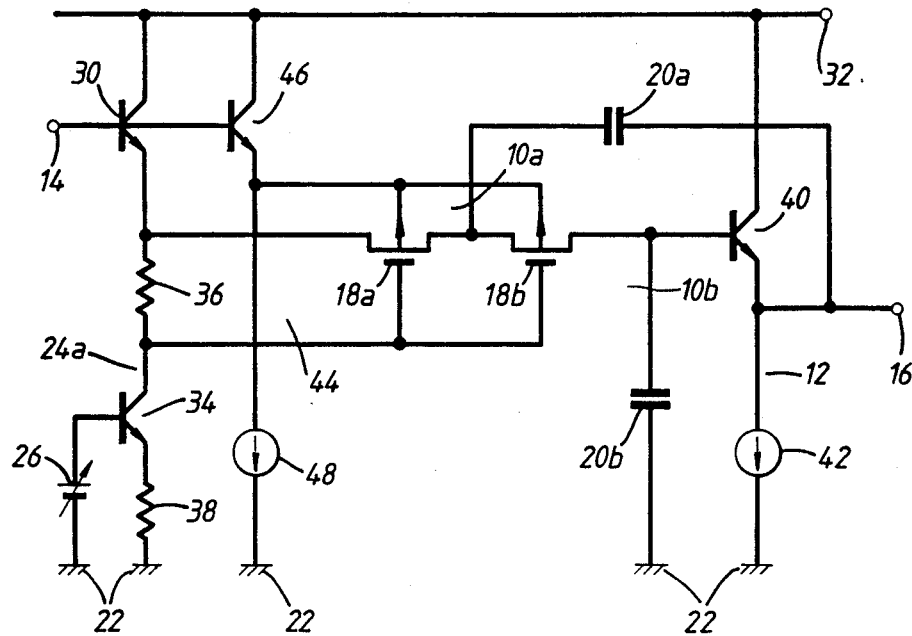
FIG. 5 is a circuit diagram showing a modification of the first embodiment of the filter circuit shown in FIG. 4.

Referring now to FIG. 5, a modification of the filter circuit shown in FIG. 4 will be described briefly.

In the filter circuit shown in FIG. 5, the input signal Vin is further supplied to the back gate terminals of the MOS FETs 18a and 18b through an emitter follower circuit 44 which is comprised of a transistor 46 and a constant current source 48 connected in series between the power supply source 32 and the ground terminal 22. Back gate terminals of MOS FETs present a relatively large capacitance, in comparison to gate terminals. Therefore, the back gate terminals are isolated from the input terminal 14 by the emitter follower circuit 44.

The input signal Vin is applied to the base terminal of the transistor 46. The signal Vin passing through the emitter follower circuit 44 is applied to the back gate terminals of the MOS FETs 18a and 18b from the emitter terminal of the transistor 46.

The AC component Vin(AC) of the input signal Vin is applied to the back gate terminals of the MOS FETs 18a and 18b through the emitter follower circuit 44. Thus, the back gate to source voltages VBGSa and VBGSb of the MOS FETs 18a and 18b are maintained constant, in spite of the variation of the input signal Vin, i.e., the AC component Vin(AC). Generally, impedance variations of the MOS FETs due to a variation of back gate to source voltages are small compared to the impedance variations, due to variations of gate to source voltages. However, the modification of the filter circuit, as shown in FIG. 5, can compensate for the impedance variations of the MOS FETs 18a and 18b more precisely.

Figure 6:
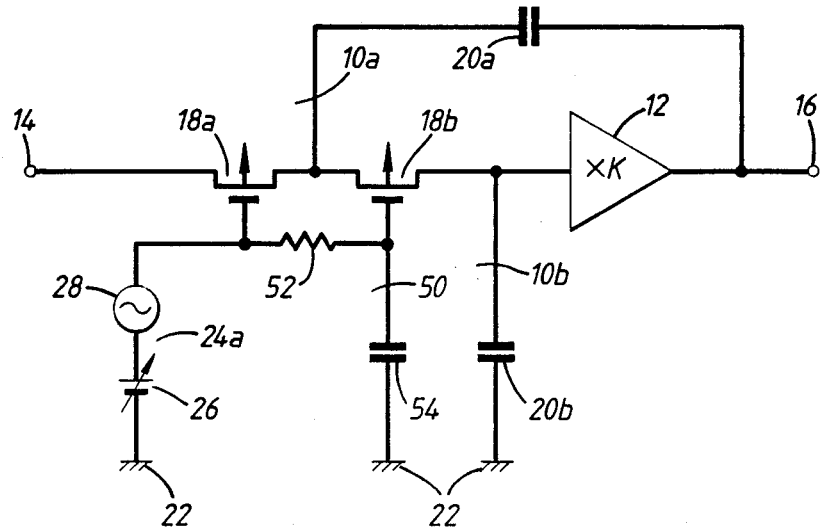
FIG. 6 is a schematic circuit diagram to show a second embodiment of the filter circuit using MOS FETs according to the present invention.

Referring now to FIG. 6, a second embodiment of the filter circuit according to the present invention will be described. As shown in FIG. 6, the second embodiment of the filter circuit according to the present invention has the configuration of an active second order filter circuit, i.e., the the so-called Sallen-kye type filter circuit.

The Sallen-kye type filter circuit shown in FIG. 6 is comprised of two time constant circuits 10a and 10b and a buffer amplifier 12 which are connected in series between an input terminal 14 and an output terminal 16. Each of the two time constant circuits 10a and 10b has a resistive device 18a (18b) comprised of a MOS FET and a capacitor 20a (20b). The MOS FETs 18a and 18b of the time constant circuits 10a and 10b and the buffer amplifier 12 are connected in series between the input terminals 14 and the output terminal 16. The capacitor 20a of the preceding time constant circuit 10a is connected in parallel with the series circuit of the MOS FET 18b and the buffer amplifier 12. The capacitor 20b of the following time constant circuit 10b is connected between the drain of the second MOS FET 18b and a ground terminal 22.

The gate of the MOS FET 18a in the preceding time constant circuit 10a is coupled to a terminal of a source 24a for supplying a control signal Vca. Another terminal of the control signal source 24a is connected to the ground terminal 22. The control signal source 24a is comprised of a series circuit of a DC control signal 26 for supplying a DC control signal Ec and an AC compensation signal source 28 for supplying an AC compensation signal Vcom.

The control signal Vca is applied to the gate terminal of the MOS FET 18a. On the other hand, the input signal Vin is applied to the source terminal thereof. The input signal Vin applied to the filter circuit includes a DC component Vin(DC) and an AC component Vin(AC).

The compensation signal Vcom supplied from the compensation signal source 28 is set to vary with the AC component Vin(AC) of the input signal Vin. Thus, the relationship Vcom=Vin(AC) is established.

The gate to source voltage VGSa of the MOS FET 18a is also given by the aforementioned equation (6). That is, the gate to source voltage VGSa of the MOS FET 18a is given as follows:

$$VGSa = Vin(DC) - Ec \quad (6)$$

The right side of the equation (6) does not include the AC component Vin(AC). Thus, the gate to source voltage VGSa of the MOS FET 18a is free from effects of variations in the input signal Vin.

The control signal Vca is also applied to the gate terminal of the second MOS FET 18b through a third time constant circuit 50. The third time constant circuit 50 is comprised of a resistor 52 and a capacitor 54. Thus, the source potential VSb of the MOS FET 18b is given as follows, $$Vsb = Vin(DC) + Ga(f) Vin(AC) \quad (7)$$

wherein Ga(f) is the gain of the MOS FET 18a from its input Vin to its output VSb.

The input signal Vin passing through the preceding MOS FET 18a is applied to the source terminal of the following MOS FET 18b. Thus, the gate potential VGb of the MOS FET 18b is given as follows, $$VGb = Ec + Gb(f) \cdot Vin(AC) \quad (8)$$

a wherein Gb(f) is the gain of the MOS FET 18b from the gate potential VGa of the MOS FET 18a to the gate potential VGb of the MOS FET 18b.

Here, it is assumed that the resistance R52 of the resistor 52 and the capacitance C54 of the capacitor 54 in the third time constant circuit 50 are defined so tha the following relationship is established:

$$Ga(f) = Gb(f) = G(f)$$

Thus, the gate to source voltage VGSb of the MOS FET 18b is obtained as follows, $$\begin{aligned} VGSb &= VSb - VGb \quad (9) \\ &= [Vin(DC) + Ga(f) \cdot Vin(AC)] - \\ &\quad [Ec + Gb(f) \cdot Vin(AC)] \\ &= [Vin(DC) + G(f) \cdot Vin(AC)] - \\ &\quad [Ec + G(f) \cdot Vin(AC)] \\ &= Vin(DC) - Ec \end{aligned}$$

In the equation (9), the terms Vin(DC) and Ec are constants. Thus, the equation (9) shows that the gate to source voltage VGSb of the MOS FET 18b is free from the AC component Vin(AC) of the input signal Vin.

Further, the gate potential VGb of the MOS FET 18b reduces similar to the source potential VSb thereof in the high frequency region due to the third time constant circuit 50. As a result, the AC component Gb(f)·Vin(AC) of the gate potential VGb of the MOS FET 18b is prevented from leaking to the drain terminal thereof.

As seen from the equations (6) and (9), the gate to source voltages VGSa and VGSb of the MOS FETs 18a and 18b are maintained almost stable for a broad frequency range, in spite of that the input signal Vin varies. As a result, the signal passing through the filter circuit is not worsened from variations of the input signal Vin. Particularly, the S/N of the signal Vin around the cut-off frequency of the filter circuit is prevented from deterioration.

Figure 7:
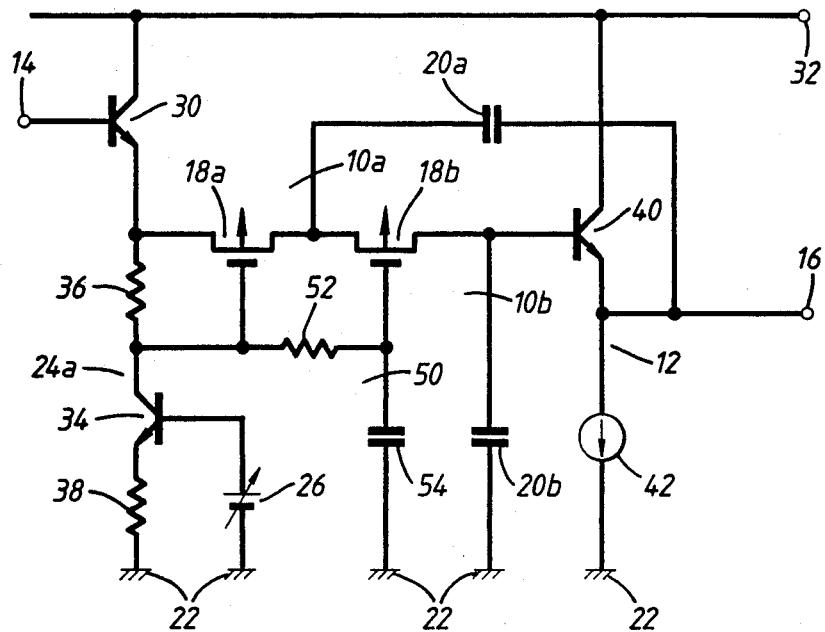
FIG. 7 is a practical circuit diagram of the filter circuit shown in FIG. 6.

Referring now to FIG. 7, a practical circuit of the filter circuit shown in FIG. 6 will be described briefly.

In the filter circuit shown in FIG. 7, an input signal Vin is supplied to the base terminal of a buffer transistor 30. The input signal Vin includes a DC component Vin(DC) and an AC component Vin(AC).

The collector terminal of the buffer transistor 30 is coupled to a power supply source 32. The emitter terminal of the buffer transistor 30 is coupled to the collector terminal of a transistor 34 through a level shift resistor 36. The transistor 34 comprises a control signal source 24a, together with the level shift resistor 36, a resistor 38 and a DC control signal source 26. The resistor 38 is connected between the emitter terminal of the transistor 34 and the ground terminal 22. The DC control signal source 26 is connected between the base terminal of the transistor 34 and the ground terminal 22.

The signal Vin passing through the buffer transistor 30 is applied to the control signal source 24a. On the other hand, a DC control signal is applied to the base terminal of the transistor 24a. As a result, a control signal Vca appears on the collector terminal of the transistor 40. The control signal Vca includes a DC control signal Ec and an AC compensation signal Vcom, which is equivalent to the AC component Vin(AC) of the input signal Vin.

The control signal Vca on the collector terminal of the transistor 34 is applied to the gate terminals of the MOS FETs 18a and 18b directly or through a third time constant circuit 50. The third time constant circuit 50 is comprised of a resistor 52 and a capacitor 54. On the other hand, the signal Vin is applied to the source terminals of the MOS FETs 18a and 18b. Thus, the gate to source voltages VGSa and VGSb of the MOS FETs 18a and 18b are maintained in constant, in spite of the variation of the signal Vin, i.e., the AC component Vin(AC) of the input signal Vin.

The signal passing through the MOS FETs 18a and 18b is applied to the buffer amplifier 12. The buffer amplifier 12 is comprised of a transistor 40 and a current source 42 connected in series between the power supply source 32 and the ground terminal 22. The signal Vin passing through MOS FETs 18a and 18b is applied to the base terminal of the transistor 40. An output terminal 16 of the filter circuit is connected to the emitter terminal of the transistor 40.

Figure 8:
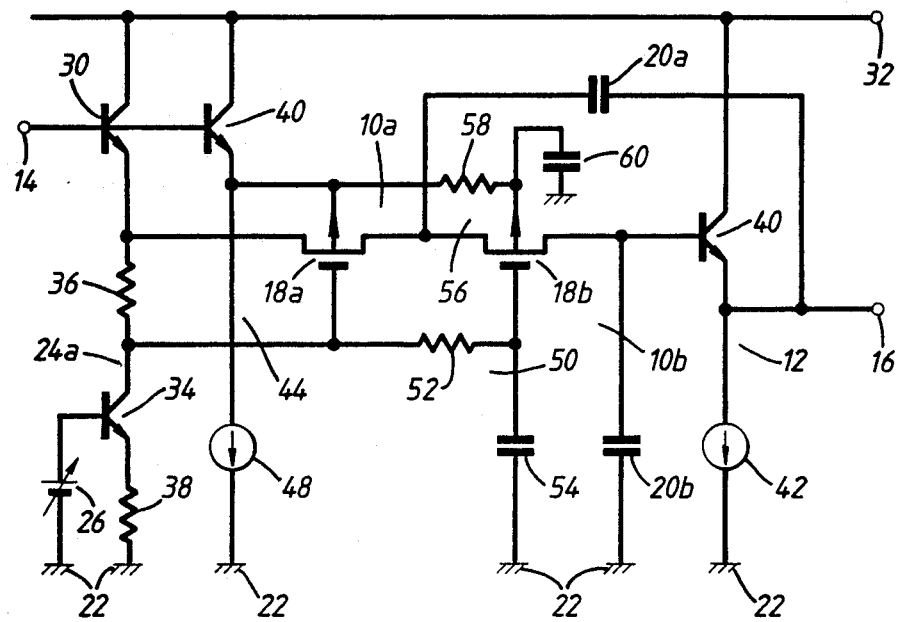
FIG. 8 is a cricuit diagram showing a modification of the second embodiment of the filter circuit shown in FIG. 7.

Referring now to FIG. 8, a modification of the filter circuit shown in FIG. 7 will be described briefly.

In the filter circuit shown in FIG. 8, the input signal Vin is further supplied to the back gate terminals of the MOS FETs 18a and 18b through an emitter follower circuit 44 which is comprised of a transistor 46 and a current source 48 connected in series between the power supply source 32 and the ground terminal 22. As stated above, back gate terminals of MOS FETs present a relatively large capacitance, compared to gate terminals. Therefore, the back gate terminals are isolated from the input terminal 14 by the emitter follower circuit 44.

The input signal Vin is applied to the base terminal of the transistor 46. The signal Vin passing through the emitter follower circuit 44 is applied to the back gate terminal of the MOS FET 18a from the emitter terminal of the transistor 46. The signal Vin is further applied to the back gate terminal of the MOS FET 18 through a fourth time constant circuit 46. The fourth time constant circuit 56 is comprised of a resistor 58 and a capacitor 60.

The AC component Vin(AC) of the input signal Vin is applied to the back gate terminals of the MOS FETs 18a and 18b through the emitter follower circuit 44. Thus, the back gate to source voltages VBGSa and VBGSb of the MOS FETs 18a and 18b are maintained constant, in spite of the variation, i.e., the AC component Vin(AC) of the input signal Vin. The impedance variation of MOS FETs due to a variation of the back gate to source voltages is small, compared to the impedance variation due to the variation of gate to source voltages. Thus, the modification of the filter circuit, as shown in FIG. 8, can compensate for the impedance variation of the MOS FETs 18a and 18b more precisely. Further, the fourth time constant circuit 56 reduces the deterioration of the S/N of the signal Vin passing through the filter circuit for a wide frequency range.

Figure 2:
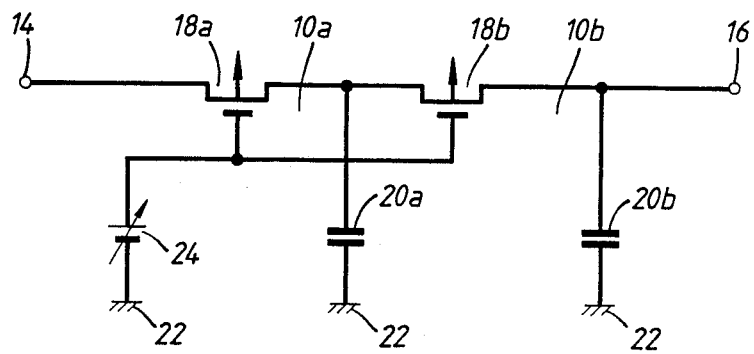
Figure 9:
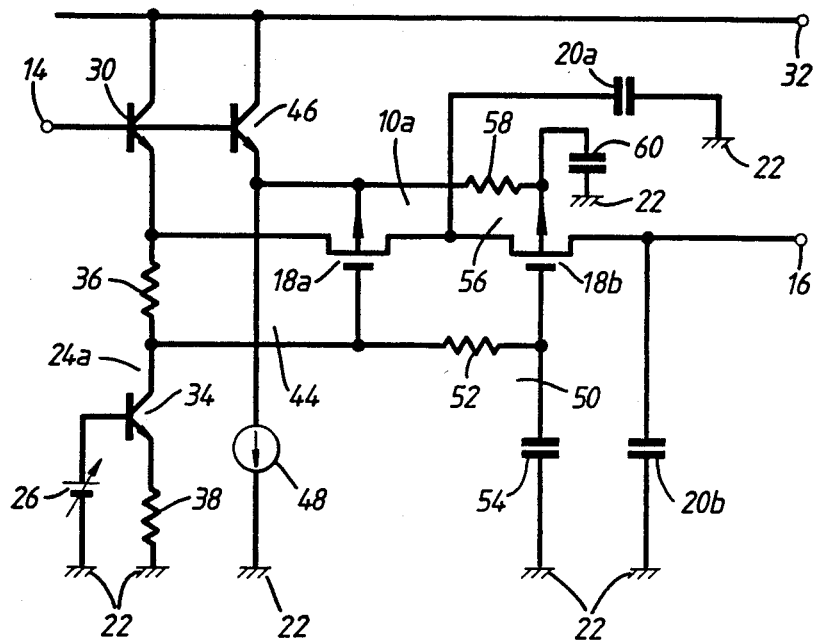
FIG. 9 is a circuit diagram showing a passive type filter circuit according to the present invention, which corresponds to the filter circuit shown in FIG. 8.

The present invention is not limited to these embodiments. For example, the concept of the present invention can be applied to a passive type filter circuit, as shown in FIG. 2. FIG. 9 shows a passive type filter circuit according to the present invention, which corresponds to the filter circuit shown in FIG. 8. Explanations about the circuit construction and the operation of the filter circuit shown in FIG. 9 will be omitted, but they will be apparent from the above descriptions made in reference to FIGS. 2 and 9. In addition, the present invention may be modified in various other ways without departing from the scope or spirit of the invention.

As described above, the present invention can provide an extremely preferable filter circuit using variable impedance devices, such as MOS FETs.

While there has been illustrated and described what are at present considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teachings of the present invention without departing from the central scope thereof. Therefore, it is intended that this invention not be limited to the particular embodiment disclosed as the best mode contemplated for carrying out this invention, but that the invention include all embodiments falling without the scope of the appended claims.

What is claimed is:

1. A filter circuit for filtering an input signal including a DC component signal with a prescribed DC level and an AC component signal comprising:

time constant circuit means for imparting the input signal with prescribed frequency characteristics, the time constant circuit means including a variable impedance device and a capacitor; and means for supplying a control signal for adjusting the impedance of the variable impedance device, the control signal supply means including DC source means for generating a DC control signal and compensation source means for generating a compensation signal equivalen to tthe AC component signal of the input signal.

2. The filter circuit of claim 1 including an integrated circuit device, the time constant circuit means being formed on the integrated circuit device.

3. The filter circuit of claim 2 wherein the variable impedance device includes at least one MOS FET.

4. The filter circuit of claim 3 wherein the time constant circuit means include first and second time constant circuits connected in series, said first and second time constant circuits each including a MOS FET and a capacitor.

5. The filter circuit of claim 4 wherein the control signal supply means is connected to the gate terminals of each of the MOS FETs.

6. The filter circuit of claim 5 further comprising a third time constant circuit and wherein the gate terminals of each MOS FET except the MOS FET of said first time constant circuit is connected to the control signal supply means through said third time constant circuit.

7. The filter circuit of claim 6 further comprising source means for generating a second compensation signal equivalent to the AC component signal of the input signal, and wherein the second compensation signal source means is connected to the back gate terminals of each of the MOS FETs.

8. The filter circuit of claim 7 wherein the second compensation signal source means includes an emitter follower circuit.

9. The filter circuit of claim 8 wherein the back gate terminals of each MOS FET except the MOS FET of said first time constant circuit is connected to the emitter follower circuit through a fourth time constant circuit.

10. The filter circuit of claim 9 further comprising a buffer amplifier connected between each of said first, second, third, and fourth time constant circuits and an output terminal of said filter circuit.

* * * * *